United States Patent
Lee et al.

(10) Patent No.: US 11,728,644 B2
(45) Date of Patent: Aug. 15, 2023

(54) ELECTRONIC DEVICE AND ELECTROSTATIC DISCHARGE PROTECTION CIRCUIT

(71) Applicant: Vanguard International Semiconductor Corporation, Hsinchu (TW)

(72) Inventors: Jian-Hsing Lee, Puzih (TW); Yeh-Jen Huang, Hsinchu (TW); Li-Yang Hong, Taoyuan (TW); Hwa-Chyi Chiou, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 43 days.

(21) Appl. No.: 17/527,966

(22) Filed: Nov. 16, 2021

(65) Prior Publication Data
US 2023/0155375 A1    May 18, 2023

(51) Int. Cl.
  *H02H 9/04*  (2006.01)
  *H03K 17/082*  (2006.01)
  *H01L 27/02*  (2006.01)

(52) U.S. Cl.
  CPC .......... *H02H 9/046* (2013.01); *H03K 17/082* (2013.01); *H01L 27/0248* (2013.01)

(58) Field of Classification Search
  CPC ... H02H 9/046; H03K 17/082; H01L 27/0248
  USPC ........................................................ 361/56
  See application file for complete search history.

(56) References Cited

U.S. PATENT DOCUMENTS

| | | | |
|---|---|---|---|
| 10,381,828 B1* | 8/2019 | Knoedgen | H01L 22/14 |
| 10,937,781 B1* | 3/2021 | Roig-Guitart | H01L 27/0255 |
| 2018/0026029 A1* | 1/2018 | Lin | H01L 28/20 |
| | | | 361/56 |
| 2019/0189641 A1 | 6/2019 | Kimura et al. | |
| 2019/0237456 A1* | 8/2019 | Lai | H03K 17/08104 |

(Continued)

FOREIGN PATENT DOCUMENTS

| | | |
|---|---|---|
| TW | 201104831 A1 | 2/2011 |
| TW | 201616613 A | 5/2016 |

(Continued)

OTHER PUBLICATIONS

Taiwanese Office Action and Search Report for Taiwanese Application No. 110137308, dated May 16, 2022.

*Primary Examiner* — Dharti H Patel
(74) *Attorney, Agent, or Firm* — Birch, Stewart, Kolasch & Birch, LLP

(57) ABSTRACT

An electronic device including a first transistor, a second transistor, a third transistor, and a resistance element is provided. The first transistor includes a first gate and is coupled between a first electrode and a second electrode. The second transistor includes a second gate, a third electrode, and a fourth electrode. The second gate is coupled to the second electrode. The third electrode is coupled to a control electrode. The third transistor includes a third gate, a fifth electrode, and a sixth electrode. The third gate is coupled to the control electrode. The fifth electrode is coupled to the fourth electrode. The sixth electrode is coupled to the second electrode. The resistance element is coupled between the third electrode and the first gate.

18 Claims, 3 Drawing Sheets

(56) References Cited

U.S. PATENT DOCUMENTS

2019/0237967 A1* 8/2019 Knoedgen ........... H01L 27/0266
2021/0335771 A1* 10/2021 Lee ..................... H01L 27/0255

FOREIGN PATENT DOCUMENTS

| TW | I672790 B | 9/2019 |
| TW | 202131475 A | 8/2021 |

* cited by examiner

ELECTRONIC DEVICE AND ELECTROSTATIC DISCHARGE PROTECTION CIRCUIT

BACKGROUND OF THE INVENTION

Field of the Invention

The invention relates to an electronic device, and more particularly to an electronic device that comprises an electrostatic discharge (ESD) protection circuit.

Description of the Related Art

High electron mobility transistors (HEMTs) are widely used in high-power semiconductor devices as they possess the favorable advantage of a high output voltage. The HEMTs can satisfy the requirements on consumer electronics products, communication hardware, electric vehicles, and home appliances. However, when an electrostatic discharge (ESD) event occurs, these HEMTs may become damaged by an ESD current caused by the ESD event.

BRIEF SUMMARY OF THE INVENTION

In accordance with an embodiment of the disclosure, an electronic device comprises a first transistor, a second transistor, a third transistor, and a resistance element. The first transistor comprises a first gate and is coupled between a first electrode and a second electrode. The second transistor comprises a second gate, a third electrode, and a fourth electrode. The second gate is coupled to the second electrode. The third electrode is coupled to a control electrode. The third transistor comprises a third gate, a fifth electrode, and a sixth electrode. The third gate is coupled to the control electrode. The fifth electrode is coupled to the fourth electrode. The sixth electrode is coupled to the second electrode. The resistance element is coupled between the third electrode and the first gate.

In accordance with another embodiment of the disclosure, an electrostatic discharge (ESD) protection circuit protects a first transistor. The first transistor is coupled between a first electrode and a second electrode. The first transistor is a high electron mobility transistor (HEMT). The ESD protection circuit comprises a resistance element, a second transistor, and a third transistor. The resistance element is coupled between the control electrode and the gate of the first transistor. The third transistor is coupled to the second transistor in series between the control electrode and the second electrode. In response to an ESD event occurring at the control electrode and the second electrode is coupled to ground, the second transistor and the third transistor are turned on, or in response to the ESD event not occurring and the voltage of the control electrode being higher than the voltage of the second electrode, the second transistor is turned off, or in response to the ESD event not occurring and the voltage of the control electrode being lower than the voltage of the second electrode, the third transistor is turned off.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
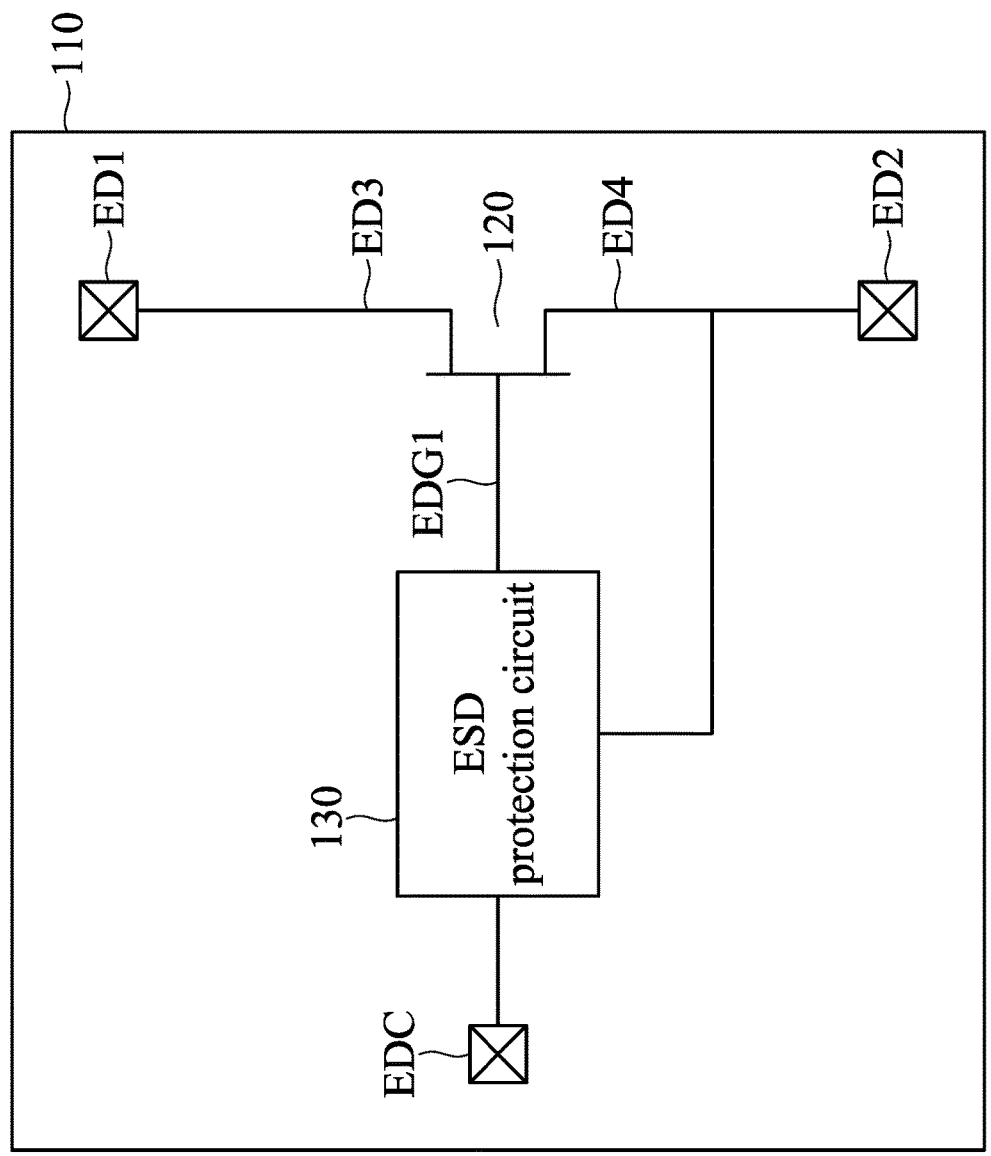
FIG. 1 is a schematic diagram of an exemplary embodiment of an electronic device according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

It will be understood that when an element or layer is referred to as being "on", "connected to" or "coupled to" another element or layer, it can be directly on, connected or coupled to the other element or layer or intervening elements or layers may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

FIG. 1 is a schematic diagram of an exemplary embodiment of an electronic device according to various aspects of the present disclosure. The electronic device 100 comprises a control electrode EDC, electrodes ED1 and ED2, an electrode 120, and an electrostatic discharge (ESD) protection circuit 130. In this embodiment, the electronic device 100 is formed on a substrate 110. In one embodiment, the substrate 110 comprises a Group III-V compound semiconductor material, such as gallium arsenide (GaAs), indium phosphide (InP), gallium nitride (GaN), or silicon germanium (SiGe). In one embodiment, the substrate 110 may be or include a ceramic material, a silicon carbide (SiC), an aluminum nitride (AlN), a sapphire substrate, metal inorganic materials, or other applicable materials. In some embodiment, the substrate 110 may be a silicon on insulator (SOI) substrate. In another embodiment, the substrate 110 may include a ceramic substrate and a pair of blocking layers (not shown) on opposite sides of the ceramic substrate. In some embodiment, the material of the sapphire substrate may be an aluminium oxide. In some embodiment, the blocking layers on opposite sides of the ceramic substrate may include one or more insulation materials and/or other applicable materials, such as a semiconductor layer. The insulation materials may be oxide, nitride, nitrogen oxides, or other applicable insulation materials. The semiconductor layer may be a silicon-containing material.

The transistor 120 is coupled between the electrodes ED1 and ED2 and comprises a gate electrode EDG1 and electrodes ED3 and ED4. The gate electrode EDG1 is coupled to the ESD protection circuit 130 and is served as the gate of the transistor 120. The electrode ED3 is coupled to the electrode ED1 and is served as a drain or a source of the transistor 120. The electrode ED4 is coupled to the electrode ED2 and is served as a source or a drain of the transistor 120. In one embodiment, when the electrode ED3 is served as a source of the transistor 120, the electrode ED4 is served as a drain of the transistor 120. However, when the electrode ED3 is served as a drain of the transistor 120, the electrode ED4 is served as a source of the transistor 120. In other embodiment, the transistor 120 is a high electron mobility transistor (HEMT).

When an ESD event occurs at the electrode ED1 and the electrode ED2 is coupled to ground, since there is a parasitic capacitor (not shown) between the gate electrode EDG1 and the electrode ED3 of the transistor 120, the voltage of the gate electrode EDG1 is increased gradually. When the voltage between the gate electrode EDG1 and the source (electrode ED4 or ED3) of the transistor 120 is higher than the threshold voltage of the transistor 120, the transistor 120 is turned on. Therefore, an ESD current is released from the electrode ED1, through the transistor 120, and to the electrode ED2.

Similarly, when an ESD event occurs at the electrode ED2 and the electrode ED1 is coupled to ground, since there is a parasitic capacitor (not shown) between the gate electrode EDG1 and the electrode ED4 of the transistor 120, the voltage of the gate electrode EDG1 is increased gradually. When the voltage between the gate electrode EDG1 and the source (electrode ED3 or ED4) of the transistor 120 is higher than the threshold voltage of the transistor 120, the transistor 120 is turned on. Therefore, an ESD current is released from the electrode ED2, through the transistor 120, and to the electrode ED1.

The ESD protection circuit 130 is coupled to the gate electrode EDG1 to avoid an ESD current entering the gate electrode EDG1. For example, when an ESD event occurs at the control electrode EDC and the electrode ED2 is coupled to ground, the ESD protection circuit 130 turns on a discharge path (not shown) to release an ESD current from the control electrode EDC to the electrode ED2. In another embodiment, when an ESD event occurs at the electrode ED2 and the control electrode EDC is coupled to ground, the ESD protection circuit 130 turns on the discharge path such that an ESD current passes from the electrode ED2, through the discharge path, and to the control electrode EDC.

When no ESD event occurs, the ESD protection circuit 130 does not turn on the discharge path. At this time, the electronic device 100 operates according to the voltages of the control electrode EDC, the electrodes ED1 and ED2. In one embodiment, the electronic device 100 is a HEMT. In such cases, the control electrode EDC is served as the gate of the HEMT, the electrode ED1 is served as the drain or the source of the HEMT, and the electrode ED2 is served as the source of a drain of the HEMT.

Figure 2:
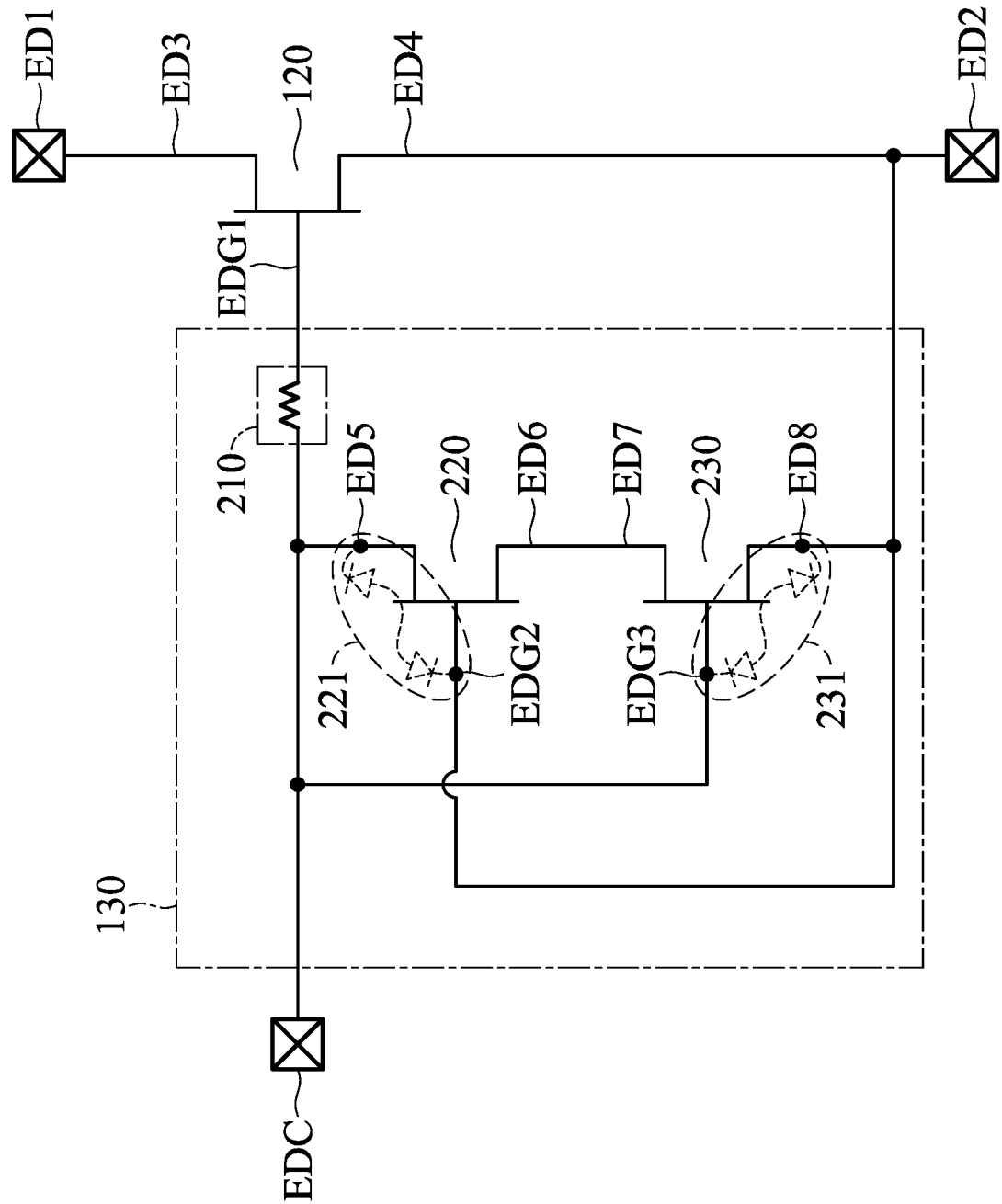
FIG. 2 is a schematic diagram of an exemplary embodiment of an electrostatic discharge (ESD) protection circuit according to various aspects of the present disclosure.

FIG. 2 is a schematic diagram of an exemplary embodiment of the ESD protection circuit according to various aspects of the present disclosure. The ESD protection circuit 130 comprises a resistance element 210, transistors 220 and 230. The resistance element 210 is coupled between the control electrode EDC and the gate electrode EDG1 to clamp the voltage of the gate electrode EDG1. For example, assume that an ESD occurs at the control electrode EDC and the electrode ED2 is coupled to ground, the resistance element 210 clamps the voltage of the gate electrode EDG1 at a predetermined value. At this time, the transistors 220 and 230 are turned on. Therefore, an ESD current passes from the control electrode EDC, through the transistors 220 and 230, and to the electrode ED2. Since the resistance element 210 resists the ESD current entering the transistor 120, the transistor 120 does not be damaged by the ESD current.

The kind of resistance element 210 is not limited in the present disclosure. In one embodiment, the resistance element 210 is a resistor. In this case, the resistor is directly connected between the control electrode EDC and the gate electrode EDG1. In other embodiments, the resistance element 210 is a transistor. In this case, the transistor served as the resistance element 210 may be a HEMT.

The transistor 220 comprises a gate electrode EDG2 and electrodes ED5 and ED6. The gate electrode EDG2 is coupled to the electrode ED2 and is served as the gate of the transistor 220. The electrode ED5 is coupled to the control electrode EDC and is served as a drain or a source of the transistor 220. In one embodiment, when the electrode ED5 is served as a drain of the transistor 220, the electrode ED6 is served as a source of the transistor 220. When the electrode ED5 is served as a source of the transistor 220, the electrode ED6 is served as a drain of the transistor 220.

The transistors 230 and 220 are connected in series between the control electrode EDC and the electrode ED2 to form a discharge path. In this embodiment, the transistor 230 comprises a gate electrode EDG3 and electrodes ED7 and ED8. The gate electrode EDG3 is coupled to the control electrode EDC and is served as the gate of the transistor 230. The electrode ED7 is coupled to the electrode ED6 and is served as a drain or a source of the transistor 230. The electrode ED8 is coupled to the electrode ED2 and is served as a source of a drain of the transistor 230. In one embodiment, when the electrode ED7 is served as a drain of the transistor 230, the electrode ED8 is served as a source of the transistor 230. When the electrode ED7 is served as a source of the transistor 230, the electrode ED8 is served as a drain of the transistor 230.

When an ESD event occurs, the ESD protection circuit 130 operates in a protection mode. In the protection mode, the transistors 220 and 230 are turned on to release an ESD current. For example, if an ESD event occurs at the control electrode EDC and the electrode ED2 is coupled to round, the transistor 230 is turned on. In such cases, since there is a parasitic capacitor between the gate electrode EDG2 and the electrode ED5 of the transistor 220, the voltage of the gate electrode EDG2 increases gradually. When the voltage difference between the gate electrode EDG2 and the source of the transistor 220 is higher than the threshold voltage of the transistor 220, the transistor 220 is turned on. Therefore, an ESD current passes from the control electrode EDC, through the transistors 220 and 230, and to the electrode ED2. Similarly, if an ESD event occurs at the electrode ED2 and the control electrode EDC is coupled to ground, the transistor 220 is turned on. At this time, since there is a parasitic capacitor between the gate electrode EDG3 and the electrode ED8, the voltage of the gate electrode EDG3 is increased gradually. When the voltage difference between the gate electrode EDG3 and the source of the transistor 230 is higher than the threshold voltage of the transistor 230, the transistor 230 is turned on. Therefore, an ESD current passes from the electrode ED2, through the transistors 220 and 230, and to the control electrode EDC.

In some embodiments, when an ESD event occurs at the control electrode EDC and the electrode ED1 is coupled to ground, the ESD protection circuit 130 enters a protection mode. In the protection mode, the voltage of the gate electrode EDG1 is increased gradually. When the voltage difference between the gate electrode EDG1 and the source of the transistor 120 is higher than the threshold voltage of the transistor 120, the transistor 120 is turned on. In this case, since there is a parasitic capacitor between the gate electrode EDG2 and the electrode ED5, the voltage of the gate electrode EDG2 is increased gradually. When the voltage difference between the gate electrode EDG2 and the source of the transistor 220 is higher than the threshold voltage of the transistor 220, the transistor 220 is turned on. At this time, the transistor 230 is also turned on, and the ESD current passes from the control electrode EDC, through the transistors 220 and 230, and to the electrode ED1.

In other embodiments, when an ESD event occurs at the electrode ED1 and the control electrode EDC is coupled to ground, the ESD protection circuit 130 enters a protection mode. In the protection mode, since there is a parasitic capacitor between the gate electrode EDG1 and the electrode ED3, the voltage of the gate electrode EDG1 is increased gradually. When the voltage different between the gate electrode EDG1 and the source of the transistor 120 is higher than the threshold voltage of the transistor 120, the transistor 120 is turned on. Therefore, the voltage of the electrode ED4 is increased. Since the gate electrode EDG2 is coupled to the electrode ED4, the transistor 220 is also turned on. At this time, since there is a parasitic capacitor between the gate electrode EDG3 and the electrode ED8, the voltage of the gate electrode EDG3 is increased gradually. When the voltage difference between the gate electrode EDG3 and the source of the transistor 230 is higher than the threshold voltage of the transistor 230, the transistor 230 is turned on. Therefore, an ESD current passes from the electrode ED1, through the transistors 120, 230 and 220, and to the control electrode EDC.

However, when there is no ESD event, the ESD protection circuit 130 operates in a normal mode. In the normal mode, the transistor 220 or 230 is turned off to reduce a leakage current. For example, if the voltage of the control electrode EDC is higher than the voltage of the electrode ED2, the transistor 220 is turned off. At this time, the transistor 230 is turned on. If the voltage of the control electrode EDC is lower than the voltage of the electrode ED2, the transistor 230 is turned off. At this time, the transistor 220 is turned on. In one embodiment, the voltages of the control electrode EDC and the electrode ED2 are within +6V~−6V.

In some embodiment, when the ESD protection circuit 130 operates in the normal mode, the ESD protection circuit 130 may have a small leakage current. For example, when the voltage of the control electrode EDC is higher than the voltage of the electrode ED2, since there is a parasitic back-to-back diode pair 231 between the gate electrode EDG3 and the electrode ED8, a small leakage current may pass from the control electrode EDC, through the parasitic back-to-back diode pair 231 to the electrode ED2. However, since the leakage current of the parasitic back-to-back diode pair is small, the leakage current can be omitted.

Similarly, when the voltage of the control electrode EDC is lower than the voltage of the electrode ED2, since there is a parasitic back-to-back diode pair between the gate electrode EDG2 and the electrode ED5, a mall leakage current may pass from the electrode ED2, through the parasitic back-to-back diode pair 221 to the control electrode EDC. However, the leakage current passing through the parasitic back-to-back diode pair 221 is small and does not cause large power consumption, the leakage current can be omitted.

In this embodiment, the gate electrode EDG2 of the transistor 220 is directly connected to the electrode ED2, and the gate electrode EDG3 of the transistor 230 is directly connected to the control electrode EDC. The types of transistors 220 and 230 are not limited in the present disclosure. In one embodiment, each of the transistors 220 and 230 is a HEMT.

Figure 3:
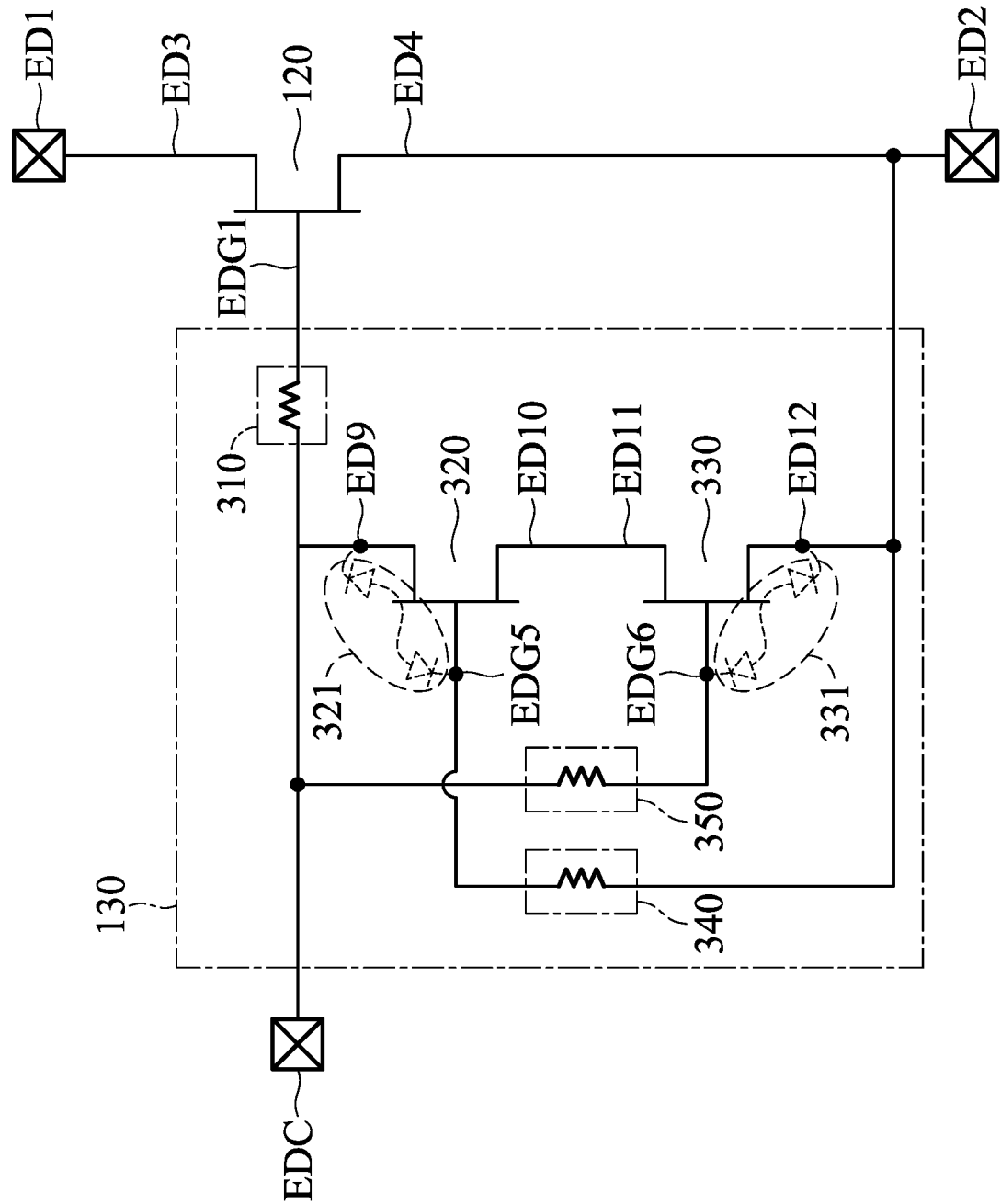
FIG. 3 is a schematic diagram of another exemplary embodiment of the ESD protection circuit according to various aspects of the present disclosure.

FIG. 3 is a schematic diagram of another exemplary embodiment of the ESD protection circuit according to various aspects of the present disclosure. The ESD protection circuit 130 comprises a resistance element 310, transistors 320 and 330, and current-limiters 340 and 350. The resistance element 310 is coupled between the control electrode EDC and the gate electrode EDG1. Since the characteristic of the resistance element 310 is similar to the characteristic of the resistance element 210 of FIG. 2, the related description is omitted here.

The transistors 320 and 330 are connected in series between the control electrode EDC and the electrode ED2. Since the characteristics of the transistors 320 and 330 shown in FIG. 3 are similar to the characteristics of the transistors 220 and 230 shown in FIG. 2, the related description is omitted here. In this embodiment, the current-limiter 340 is coupled between the gate electrode EDG5 and the electrode ED2 to limit the current passing into the gate electrode EDG5. The current-limiter 350 is coupled between the gate electrode EDG6 and the control electrode EDC to limit the current passing into the gate electrode EDG6. In one embodiment, the current-limiters 340 and 350 are resistors, but the disclosure is not limited thereto. In other embodiments, the current-limiters 340 and 350 have HEMTs.

When an ESD event occurs at the control electrode EDC and the electrode ED2 is coupled to ground, the transistor 330 is turned on. At this time, since there is a parasitic capacitor between the gate electrode EDG5 and the electrode ED9, the voltage of the gate electrode EDG5 is increased gradually. When the voltage difference between the gate electrode EDG5 and the source of the transistor 320 is higher than the threshold voltage of the transistor 320, the transistor 320 is turned on. Therefore, an ESD current passes from the control electrode EDC, through the transistors 320 and 330, and to the electrode ED2. Similarly, if an ESD event occurs at the electrode ED2 and the control electrode EDC is coupled to ground, the transistor 320 is turned on. At this time, there is a parasitic capacitor between the gate electrode EDG6 and the electrode ED12, the voltage of the gate electrode EDG6 is increased gradually. When the voltage difference between the gate electrode EDG6 and the source of the transistor 330 is higher than the threshold voltage of the transistor 330, the transistor 330 is turned on. Therefore, an ESD current passes from the electrode ED2 to the control electrode EDC via the transistors 320 and 330.

In some embodiments, when an ESD event occurs at the control electrode EDC and the electrode ED1 is coupled to ground, the ESD protection circuit 130 operates in a protection mode. In the protection mode, the voltage of the gate electrode EDG1 is increased gradually. When the voltage difference between the gate electrode EDG1 and the source of the transistor 120 is higher than the threshold voltage of the transistor 120, the transistor 120 is turned on. In this case, since there is a parasitic capacitor between the gate electrode EDG5 and the electrode ED9, the voltage of the gate electrode EDG5 is increased gradually. When the voltage difference between the gate electrode EDG5 and the source of the transistor 320 is higher than the threshold voltage of the transistor 320, the transistor 320 is turned on. In addition, since the transistor 330 is also turned on, the ESD current passes from the control electrode EDC to the electrode ED1 via the transistors 320, 330, and 120.

In other embodiments, when an ESD event occurs on the electrode ED1 and the control electrode EDC is coupled to ground, the ESD protection circuit 130 operates in a protection mode. In the protection mode, since there is a parasitic capacitor between the gate electrode EDG1 and the electrode ED3, the voltage of the gate electrode EDG1 is increased gradually. When the voltage difference between the gate electrode EDG1 and the source of the transistor 120 is higher than the threshold voltage of the transistor 120, the transistor 120 is turned on. Since the gate electrode EDG5 is coupled to the electrode ED4 via the current limiter 340, the transistor 320 is also turned on. At this time, since there is a parasitic capacitor between the gate electrode EDG6 and the electrode ED12, the voltage of the gate electrode EDG6 is increased gradually. When the voltage difference between the gate electrode EDG6 and the source of the transistor 330 is higher than the threshold voltage of the transistor 330, the transistor 330 is turned on. Therefore, the ESD current passes from the electrode ED1, through the transistors 120, 330, and 320 and to the control electrode EDC.

However, when no ESD event occurs, the ESD protection circuit 130 operates in a normal mode. In the normal mode, the transistor 320 or 330 is turned off to reduce the leakage current. For example, if the voltage of the control electrode EDC is higher than the voltage of the electrode ED2, the transistor 320 is turned off. If the voltage of the control electrode EDC is lower than the voltage of the electrode ED2, the transistor 330 is turned off.

In some embodiments, when the ESD protection circuit 130 operates in the normal mode, the ESD protection circuit 130 has a small leakage current. For example, when the voltage of the control electrode EDC is higher than the voltage of the electrode ED2, a small leakage current may pass from the control electrode EDC, through the current limiter 350, the parasitic back-to-back diode pair 331, and into the electrode ED2. Similarly, when the voltage of the control electrode EDC is lower than the voltage of the electrode ED2, a small leakage current may pass from the electrode ED2, through the current limiter 340, the parasitic back-to-back diode pair 321, and into the control electrode EDC. However, the leakage current passing through the parasitic back-to-back diode pair 321 or 331 is small, it does not cause a large power consumption. Therefore, the leakage current passing through the parasitic back-to-back diode pair 321 or 331 can be omitted.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electronic device comprising:
   a first transistor comprising a first gate and coupled between a first electrode and a second electrode;
   a second transistor comprising a second gate, a third electrode, and a fourth electrode, wherein the second gate is coupled to the second electrode, and the third electrode is coupled to a control electrode;
   a third transistor comprising a third gate, a fifth electrode, and a sixth electrode, wherein the third gate is coupled to the control electrode, the fifth electrode is coupled to the fourth electrode, and the sixth electrode is coupled to the second electrode; and
   a resistance element coupled between the third electrode and the first gate,
   wherein in response to an electrostatic discharge (ESD) event occurring at the first electrode and the second electrode being coupled to ground, the first transistor is turned on.

2. The electronic device as claimed in claim 1, wherein the first transistor, the second transistor and the third transistor are turned on in response to the ESD event occurring at the control electrode and the first electrode being coupled to ground, or the ESD event occurring at the control electrode and the second electrode being coupled to ground, or the ESD event occurring at the first electrode and the control electrode being coupled to ground.

3. The electronic device as claimed in claim 1, wherein the second gate is directly connected to the second electrode, and the third gate is directly connected to the control electrode.

4. The electronic device as claimed in claim 1, further comprising:
   a first current-limiter coupled between the second gate and the second electrode; and
   a second current limiter coupled between the control electrode and the third gate.

5. The electronic device as claimed in claim 4, wherein the first current-limiter and the second current-limiter are resistors.

6. The electronic device as claimed in claim 4, wherein the second transistor comprises a first parasitic back-to-back diode pair, and in response to the ESD event not occurring and a voltage of the control electrode being higher than a voltage of the second electrode, a first leakage current passes from the control electrode, through the first parasitic back-to-back diode pair and the first current-limiter, and to the second electrode.

7. The electronic device as claimed in claim 6, wherein the third transistor comprises a second parasitic back-to-back diode pair, and in response to the ESD event not occurring and the voltage of the control electrode being lower than the voltage of the second electrode, a second leakage current passes from the second electrode, through the second parasitic back-to-back diode pair and the second current-limiter, and to the control electrode.

8. The electronic device as claimed in claim 1, wherein:
   in response to the ESD event not occurring and a voltage of the control electrode being higher than a voltage of the second electrode, the second transistor is turned off, and
   in response to the ESD event not occurring and the voltage of the control electrode being higher than the voltage of the second electrode, the third transistor is turned off.

9. The electronic device as claimed in claim 1, wherein the first transistor is a high electron mobility transistor.

10. The electronic device as claimed in claim 9, wherein the second transistor and the third transistor are high electron mobility transistors.

11. An electrostatic discharge (ESD) protection circuit protecting a first transistor which is coupled between a first electrode and a second electrode and is a high electron mobility transistor (HEMT), comprising:
  a resistance element coupled between a control electrode and a gate of the first transistor;
  a second transistor; and
  a third transistor coupled to the second transistor in series between the control electrode and the second electrode, wherein:
    in response to an ESD event occurring at the control electrode and the second electrode is coupled to ground, the second transistor and the third transistor are turned on, or
    in response to the ESD event not occurring and a voltage of the control electrode being higher than a voltage of the second electrode, the second transistor is turned off, or
    in response to the ESD event not occurring and the voltage of the control electrode being lower than the voltage of the second electrode, the third transistor is turned off,
    in response to the ESD event occurring at the first electrode and the second electrode being coupled to ground, the first transistor is turned on.

12. The ESD protection circuit as claimed in claim 11, wherein:
  in response to the ESD event occurring at the control electrode and the first electrode being coupled to ground, the first transistor, the second transistor and the third transistor are turned on, and
  in response to the ESD event occurring at the first electrode and the control electrode being coupled to ground, the first transistor, the second transistor and the third transistor are turned on.

13. The ESD protection circuit as claimed in claim 11, wherein a gate of the second transistor is directly connected to the second electrode, and a gate of the third transistor is directly connected to the control electrode.

14. The ESD protection circuit as claimed in claim 11, further comprising:
  a first current-limiter coupled between a gate of the second transistor and the second electrode; and
  a second current-limiter coupled between the control electrode and a gate of the third transistor.

15. The ESD protection circuit as claimed in claim 14, wherein each of the first current-limiter and the second current-limiter is a resistor.

16. The ESD protection circuit as claimed in claim 15, wherein the second transistor comprises a first parasitic back-to-back diode pair, and in response to the ESD event not occurring and a voltage of the control electrode being higher than a voltage of the second transistor, a first leakage current passes from the control electrode, through the first parasitic back-to-back diode pair and the first current-limiter, and to the second electrode.

17. The ESD protection circuit as claimed in claim 16, wherein the third transistor comprises a second parasitic back-to-back diode pair, and in response to the ESD event not occurring and the voltage of the control electrode being lower than the voltage of the second electrode, a second leakage current passes from the second electrode, through the second parasitic back-to-back diode pair and the second current-limiter, and to the control electrode.

18. The ESD protection circuit as claimed in claim 11, wherein each of the second and third transistors is a HEMT.

* * * * *